(12) United States Patent
Nakahara

(10) Patent No.: US 7,872,269 B2
(45) Date of Patent: Jan. 18, 2011

(54) GALLIUM NITRIDE SEMICONDUCTOR LIGHT EMITTING ELEMENT

(75) Inventor: Ken Nakahara, Kyoto (JP)

(73) Assignee: ROHM Co., Ltd., Kyoto-fu (JP)

( * ) Notice: Subject to any disclaimer, the term of this patent is extended or adjusted under 35 U.S.C. 154(b) by 146 days.

(21) Appl. No.: 12/085,836

(22) PCT Filed: Nov. 29, 2006

(86) PCT No.: PCT/JP2006/323853

§ 371 (c)(1), (2), (4) Date: May 30, 2008

(87) PCT Pub. No.: WO2007/063920

PCT Pub. Date: Jun. 7, 2007

(65) Prior Publication Data

US 2009/0146160 A1    Jun. 11, 2009

(30) Foreign Application Priority Data

Nov. 30, 2005    (JP) .............................. 2005-346845

(51) Int. Cl.
*H01L 33/00*    (2010.01)

(52) U.S. Cl. ........................... 257/94; 257/85; 257/96; 257/101; 257/103; 257/E33.025; 257/E33.028; 257/E33.034; 257/E33.036; 257/E33.037

(58) Field of Classification Search .................. 257/94, 257/96, 101, 85, 103, E33.025, E33.028, 257/E33.034, E33.036, E33.037
See application file for complete search history.

(56) References Cited

U.S. PATENT DOCUMENTS

| 2003/0015724 | A1* | 1/2003 | Nakamura et al. | 257/103 |
| 2005/0214992 | A1* | 9/2005 | Chakraborty et al. | 438/172 |
| 2008/0251781 | A1* | 10/2008 | Han et al. | 257/13 |

FOREIGN PATENT DOCUMENTS

| JP | 2000216497 | 8/2000 |
| JP | 2002164623 | 6/2002 |
| JP | 2004335559 | 11/2004 |
| JP | 2006196490 | 7/2006 |

\* cited by examiner

*Primary Examiner*—Long K Tran
(74) *Attorney, Agent, or Firm*—Rebin & Berdo, PC

(57) ABSTRACT

Provided is a gallium nitride semiconductor light emitting element capable of stabilizing a drive voltage by reducing carrier depletion attributable to spontaneous polarization and piezo polarization generated at the interface between an AlGaN semiconductor layer and a GaN semiconductor layer.

A gallium nitride semiconductor crystal 2 including a light emitting region is formed on the R plane of a sapphire substrate 1. In addition, in another constitution, a gallium nitride semiconductor crystal 2 is formed on the A plane of a GaN substrate 3 or on the M plane of a GaN substrate 4. The growth surface of these gallium nitride semiconductor crystals 2 are not an N (nitrogen) polar face or a Ga polar face but are non-polar faces. This can decrease the strength of an electric field caused by spontaneous polarization and piezo polarization generated at the interface of GaN/AlGaN at the p side. Thus, carrier depletion can be avoided.

2 Claims, 7 Drawing Sheets

(a)

(b)

(c)

GALLIUM NITRIDE SEMICONDUCTOR LIGHT EMITTING ELEMENT

TECHNICAL FIELD

The present invention relates to a gallium nitride semiconductor light emitting element using GaN.

BACKGROUND ART

Semiconductor light emitting elements such as a semiconductor laser element and a light emitting diode emitting blue or violet light include gallium nitride semiconductor light emitting elements. At the time of production of a GaN-based semiconductor element, since it is difficult to produce a substrate made from GaN, a GaN semiconductor layer is epitaxially grown on a substrate made from sapphire, SiC, Si, or the like.

For example, an undoped GaN buffer layer, an n-GaN contact layer, an n-AlGaN clad layer, an n-GaN light guide layer, an InGaN multiple quantum well (MQW) active layer, and the like are sequentially formed on the face (0001) of a sapphire substrate by MOCVD (metal organic chemical vapor deposition). On the active layer, a p-GaN light guide layer, a p-AlGaN clad layer, a p-GaN contact layer, and the like are sequentially formed.

These layers from the p-GaN contact layer to a partial region of the n-GaN contact layer are removed by etching to expose the n-GaN contact layer. An n electrode is formed on the exposed upper face of the n-GaN contact layer, and a p electrode is formed on the upper face of the p-GaN contact layer.

FIG. 9 shows a diagram of a unit cell indicating plane directions of a sapphire single crystal. The crystal structure of sapphire can be approximated by a hexagonal system as in the drawing. When a GaN semiconductor layer is laminated on a sapphire substrate, the C face (0001) of a sapphire substrate is used. The GaN semiconductor laminated on the sapphire substrate in the direction (0001) has: a wurtzite crystal structure in the direction (0001); and a crystal polarity (which grows in the C axis direction) where the cation elements of Ga are in a growth surface direction as shown in FIG. 7. In other words, the layers are laminated in a direction perpendicular to the sapphire substrate, i.e., the C axis [0001] direction.

FIG. 10 illustrates band gap energies in the valence bands of the lamination region of an n-AlGaN clad layer 41, an n-GaN light guide layer 42, an MQW active layer 43, a p-GaN light guide layer 44 and a p-AlGaN clad layer 45, in a gallium nitride semiconductor emitting element produced by lamination of a GaN semiconductor layer on the above mentioned sapphire substrate. Patent Document 1: JP-A 2000-216497

DISCLOSURE OF THE INVENTION

Problems to be Solved by the Invention

As in the above conventional art, although the Ga polar face is in a growth surface direction in a GaN semiconductor layer laminated on the C face (0001) of a sapphire substrate, the grown GaN semiconductor layer does not have a symmetry in the C axis direction at its GaN/AlGaN hetero junction interface and has a wurtzite structure, in which the epitaxial membrane grown on the C plane has front and back sides. Thus, spontaneous polarization and piezo polarization attributable to interface stress occur to thereby generate a polarization charge, and then to generate an electric field at the hetero junction bond interface. This electric field causes electrons to be drawn into the active layer on the n side, creating only a small problem.

However, on the p side, as shown in FIG. 10, since an electric field E is generated from a p-GaN light guide layer 44 toward a p-AlGaN clad layer 45, holes flowing from the p-AlGaN clad layer 45 to the p-GaN light guide layer 44 cannot flow into an MQW active layer 43 due to electric repulsion caused by the generated electric field E. This generates carrier depletion to raise the drive voltage. A raise of the drive voltage shortens the life of a gallium nitride semiconductor light emitting element.

In particular, Mg is contained in the p-AlGaN clad layer 45 as a p type impurity. When this Mg concentration is $1 \times 10^{19}$ $cm^{-3}$ or less, piezo polarization generated at the interface between the p-GaN light guide layer 44 and the p-AlGaN clad layer 45 rapidly increases, causing a problem that an electric field E illustrated in FIG. 10 greatly increases.

The present invention was made to solve the above described problem, and an object thereof is to provide a gallium nitride semiconductor light emitting element that allows a drive voltage to be stabilized by reducing: carrier depletion due to spontaneous polarization and piezo polarization generated at the interface between an AlGaN semiconductor layer and a GaN semiconductor layer.

Means for Solving the Problems

For the achievement of the above object, provided is a gallium nitride semiconductor light emitting element which includes at least an n type semiconductor layer, a light emitting region and a p type semiconductor layer, in listed order, on a substrate, and which has an interface between an AlGaN semiconductor layer and a GaN semiconductor layer. The AlGaN semiconductor layer is formed at the above p type semiconductor layer side and contains Mg of $10^{19}$ $cm^{-3}$ or less, and the GaN semiconductor layer is positioned closer to the n layer than the AlGaN semiconductor layer is. The gallium nitride semiconductor light emitting element is characterized in that, from the above n type semiconductor layer to the AlGaN semiconductor layer, the growth face is not formed to have nitrogen polarity or Ga polarity of GaN, but is formed in a non-polar direction.

In addition, in another embodiment the invention, a gallium nitride semiconductor light emitting element includes at least an n type semiconductor layer, a light emitting region and a p type semiconductor layer, in listed order, on a substrate, and has an interface between an AlGaN semiconductor layer and an InGaN semiconductor layer. The AlGaN semiconductor layer is formed at the above p type semiconductor layer side and contains Mg of $10^{19}$ $cm^{-3}$ or less, and the InGaN semiconductor layer is positioned on the n side relative to the AlGaN semiconductor layer. The gallium nitride semiconductor light emitting element is characterized in that, from the n type semiconductor layer to the AlGaN semiconductor layer, the growth face is not formed to have nitrogen polarity or Ga polarity of GaN, but is formed in a non-polar direction.

Additionally, in yet another embodiment of the invention, a gallium nitride semiconductor light emitting element includes at least an n type semiconductor layer, a light emitting region and a p type semiconductor layer, in listed order, on a substrate, and has an interface between an $Al_XGaN$ semiconductor layer and an $Al_YGaN$ semiconductor layer (X>Y). The $Al_XGaN$ semiconductor layer is formed at the above p type semiconductor layer side and contains Mg of $10^{19}$ $cm^{-3}$ or less, and the $Al_YGaN$ semiconductor layer (X>Y) is positioned on the n side relative to the p type $Al_X$-GaN semiconductor layer. The gallium nitride semiconductor light emitting element is characterized in that, from the above n type semiconductor layer to the $Al_X$GaN semiconductor layer, the growth face is not formed to have nitrogen polarity or Ga polarity of GaN, but is formed in a non-polar direction.

Effects of the Invention

According to the present invention, the growth direction of a gallium nitride semiconductor laminated on a substrate (a direction perpendicular to the substrate) is formed on a face different from the N (nitrogen) polarity and the Ga polarity of GaN, i.e., the A or M plane. Thus, an electric field generated by spontaneous polarization and piezo polarization at the interface between an AlGaN semiconductor layer on the p side and a GaN semiconductor layer can be made very small. Carrier depletion can be avoided to stabilize the drive voltage.

DESCRIPTION OF SYMBOLS

1. Sapphire substrate
2. Gallium nitride semiconductor crystal
3. GaN substrate
4. GaN substrate

BEST MODE FOR CARRYING OUT THE INVENTION

Figure 1:
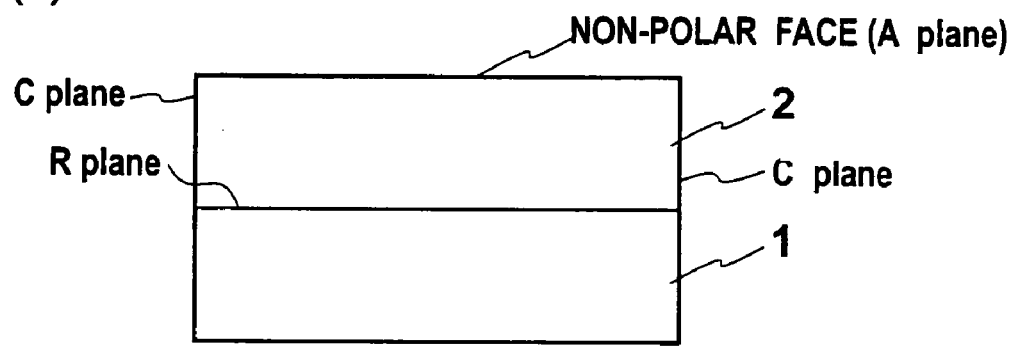
FIG. 1 is a diagram illustrating a schematic construction of a gallium nitride semiconductor light emitting element of the present invention.
Figure 1:
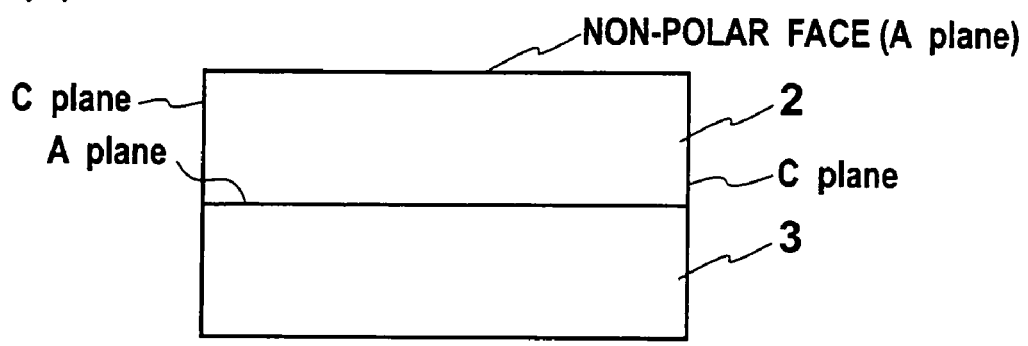
Figure 1:
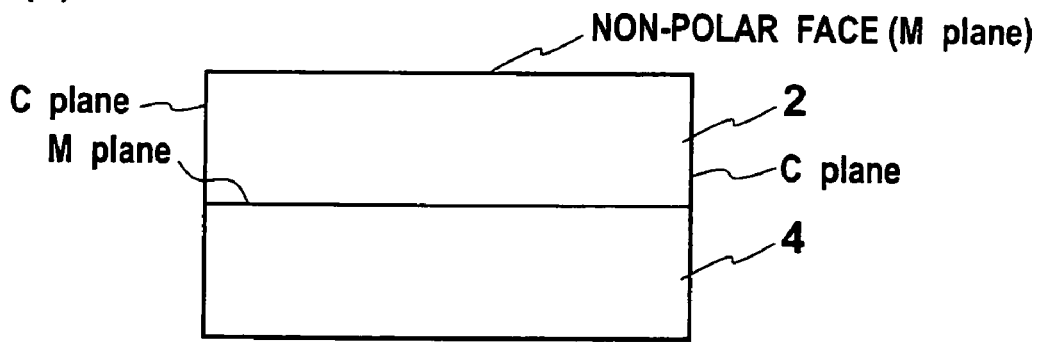
Figure 8:
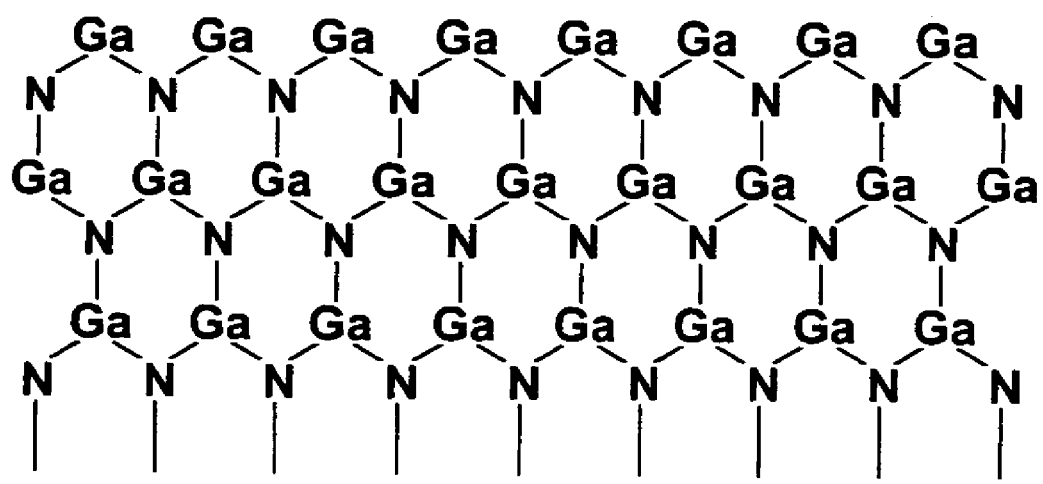
FIG. 8 is a diagram schematically illustrating a crystal structure of a gallium nitride semiconductor crystal when the growth surface is the Ga polar face.
Figure 9:
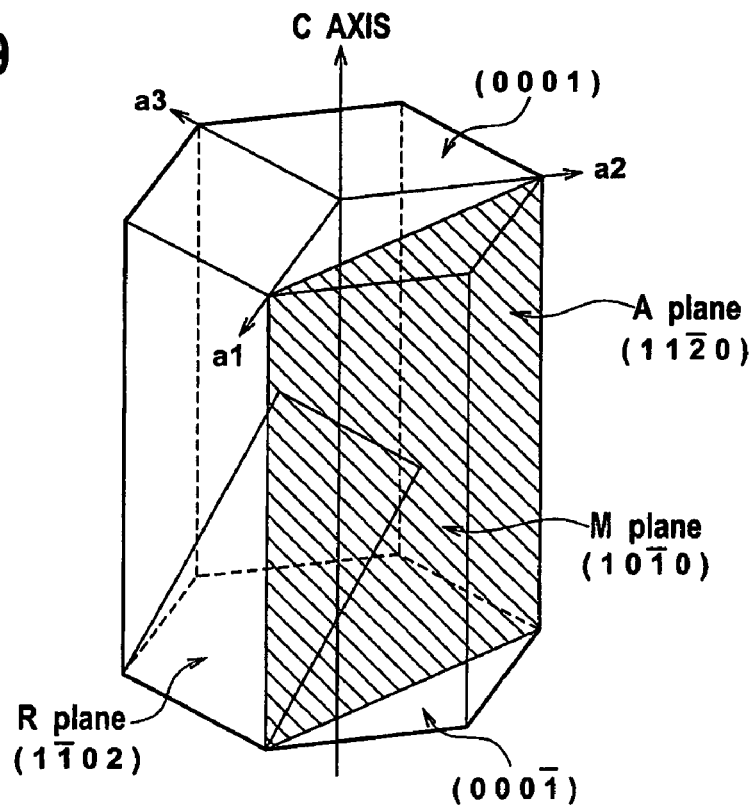
FIG. 9 is a unit cell diagram illustrating a face direction of a hexagonal system.

Hereinafter, one embodiment of the present invention will be set forth with reference to drawings. FIG. 1 shows a schematic construction of a gallium nitride semiconductor light emitting element. A gallium nitride semiconductor light emitting element of FIG. 1(a) has a gallium nitride semiconductor crystal 2 which contains a light emitting region and is formed on a sapphire substrate 1. The gallium nitride semiconductor crystal 2 is formed on the R plane (1-102) of a sapphire substrate 1 by the MOCVD method or the like, and its growth surface grows on the A plane. The A plane, as shown in FIGS. 8 and 9, is not a Ga polar face or an N (nitrogen) polar face, but a non-polar face.

In addition, JP-A 2000-216497 as Patent Document 1 describes that a GaN semiconductor layer can be laminated using the A plane or the M plane of a sapphire substrate to make the growth face the M plane or the A plane. However, normally when the A plane or the M plane of a sapphire substrate is used, the growth direction becomes the C axis, whereby the growth surface of the GaN semiconductor layer is not considered to be the M plane or the A plane.

Additionally, a gallium nitride semiconductor light emitting element of FIG. 1(b) has the gallium nitride semiconductor crystal 2 containing a light emitting region laminated on a GaN substrate 3. The gallium nitride semiconductor crystal 2 is formed on the A plane (11-20) of the GaN substrate 3 by the MOCVD method or the like, and its growth surface grows on the A plane. The A plane, as described above, is not a Ga polar face or an N (nitrogen) polar face, but a non-polar face.

Moreover, a gallium nitride semiconductor light emitting element of FIG. 1(c) has the gallium nitride semiconductor crystal 2 containing a light emitting region laminated on the GaN substrate 3. The gallium nitride semiconductor crystal 2 is formed on the M plane (10-10) of the GaN substrate 3 by the MOCVD method or the like, and its growth surface grows on the M plane. The M plane, as shown in FIGS. 8 and 9, is not a Ga polar face or an N (nitrogen) polar face, but a non-polar face.

As described above, by growth of the gallium nitride semiconductor crystal 2, the growth surface of the gallium nitride semiconductor crystal 2 does not become the Ga polar face or the N (nitrogen) polar face, but anon-polar face. Since the strength of an electric field E at the GaN/AlGaN interface of the grown gallium nitride semiconductor crystal 2 becomes very weak as compared with the strength of the electric field E generated when a growth surface is the Ga polar face shown in FIG. 10, a conventional technique, carrier depletion can be avoided. In particular, in a case where Mg is doped as an impurity in an AlGaN semiconductor layer and the concentration of this Mg is $1 \times 10^{19}$ $cm^{-3}$ or less, piezo polarization generated at the interface between the AlGaN semiconductor layer and the GaN semiconductor layer is rapidly increased to cause the electric field E to increase rapidly when the growth surface is the nitrogen polar face as before. However, making the growth surface a non-polar face as in the present invention causes the electric field E to be very small, whereby the effect is remarkable.

Figure 2:
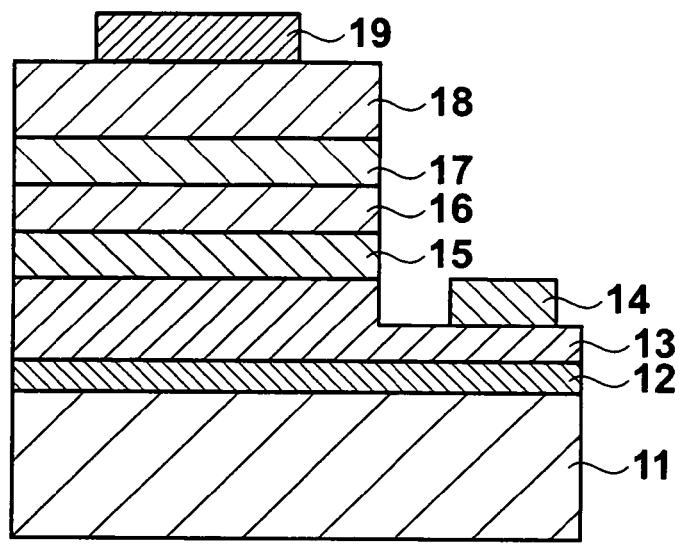
FIG. 2 is a sectional view illustrating one example of an LED structure in a gallium nitride semiconductor light emitting element.

One example of an LED in a gallium nitride semiconductor light emitting element is shown in FIG. 2. The gallium nitride semiconductor crystal 2 is grown on the R plane of a sapphire substrate 1 to thereby make the growth surface the A plane. On the sapphire substrate 11 are formed a buffer layer 12, an n type contact layer 13, an n type super lattice layer 15, an MQW active layer 16, a p type electron block layer 17 and a p type contact layer 18. Furthermore, on the p type contact layer 18 is formed a positive electrode (p electrode) 19, and on the n type contact layer 13 is formed a negative electrode (n electrode) 14. The buffer layer 12, the n type contact layer 13, the n type super lattice layer 15, the MQW active layer 16, the p type electron block layer 17 and the p type contact layer 18 all have growth surfaces of the A plane.

Figure 3:
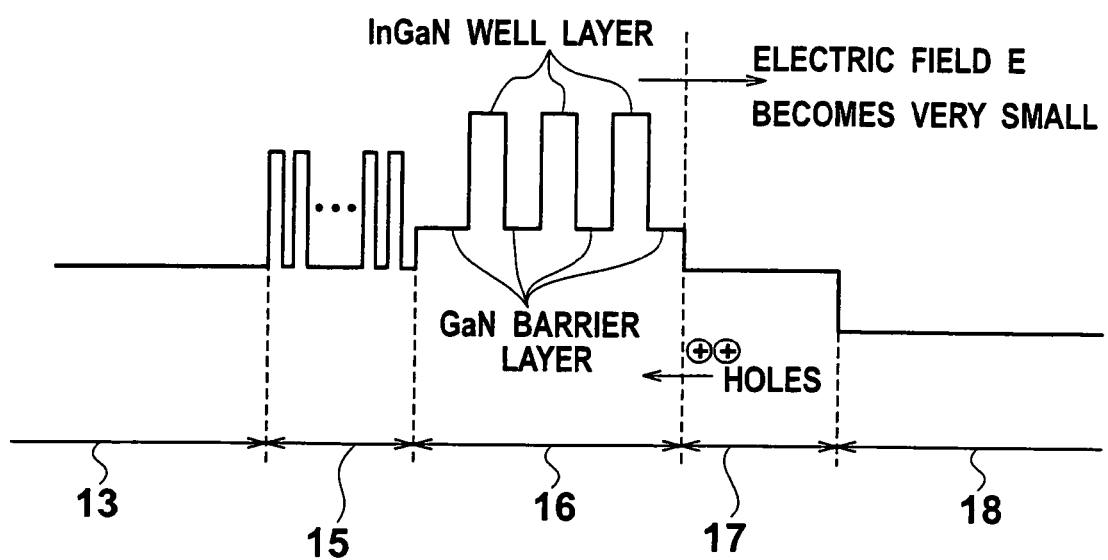
FIG. 3 is a diagram illustrating band gap energies in a valence band of the LED of FIG. 2.

Here, FIG. 3 illustrates band gap energies in valence bands in a case where the buffer layer 12 is constituted by undoped GaN, then type contact layer 13 is constituted by n-GaN, the n type super lattice layer 15 has a super lattice structure produced by alternately laminating an n-GaN thin film and an n-InGaN thin film for 5 to 10 cycles, the MQW active layer 16 has a multiple quantum well structure constituted by a well layer of InGaN and a barrier layer of GaN or InGaN, respectively, the p type electron block layer 17 is p-AlGaN produced by doping Mg therein as an impurity at a concentration of $1 \times 10^{19}$ cm$^{-3}$ or less, and the p type contact layer 18 is constituted by p-GaN.

Figure 10:
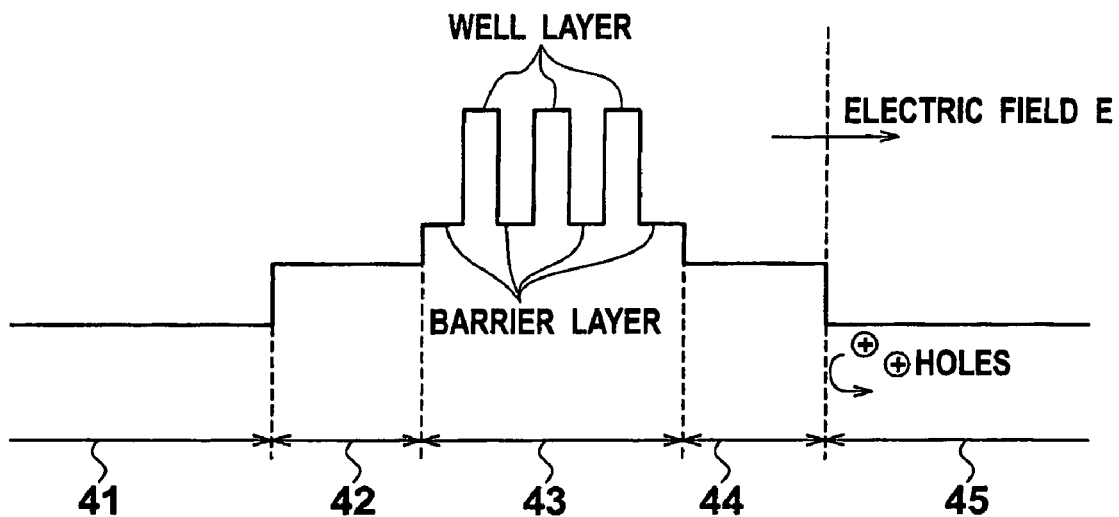
FIG. 10 is a diagram illustrating band gap energies in a valence band of a conventional gallium nitride semiconductor light emitting element.

As shown in FIG. 10, when a gallium nitride semiconductor crystal is formed on a Ga polar face as a growth surface as before, an electric field E is generated from GaN semiconductor layer toward an AlGaN semiconductor layer at the interface between the p-GaN light guide layer and the p-AlGaN clad layer. However, when the growth surface becomes a non-polar face, as shown in FIG. 3, although an electric field E is generated from the GaN barrier layer of the MQW active layer 16 toward the p-AlGaN electron block layer 17, the strength of this electric field becomes extremely smaller than the strength of a conventional electric field illustrated in FIG. 10. Thus, holes injected from the positive electrode 19 side tend to be injected into the MQW active layer 16 side of a light emitting region and, therefore carrier depletion can be avoided.

As a method of production, the well-known MOCVD method or the like is used for the growth. For example, on the R plane of the sapphire substrate 11, the buffer layer 12 of approximately 1 to 3 μm including undoped GaN, the Si-doped GaN contact layer 13 of approximately 1 to 5 μm, and the following layers of approximately 0.2 to 1 μm, respectively, are laminated sequentially: the Si-doped InGaN/GaN super lattice layer 15; the MQW active layer 16; the Mg-doped AlGaN electron block layer 17; and the Mg-doped GaN contact layer 18. The MQW active layer 16 is formed in a multi-layer structure in which a well layer including $In_{0.17}Ga_{0.83}N$ of 1 to 3 nm and a barrier layer including $In_XGaN$ ($0 \leq X \leq 0.05$) of 10 to 20 nm are alternately laminated on each other for 3 to 10 cycles.

After the formation of the p type contact layer 18, parts of the p type contact layer 18, the p type electron block layer 17, the MQW active layer 16, the n type super lattice layer 15 and the n type contact layer 13 are mesa etched by reactive ion etching or the like and removed. Thereafter, on the etched face of the n type contact layer 13 is formed the negative electrode 14 by vapor deposition and on the p type contact layer 18 is formed the positive electrode 19 by vapor deposition.

Figure 4:
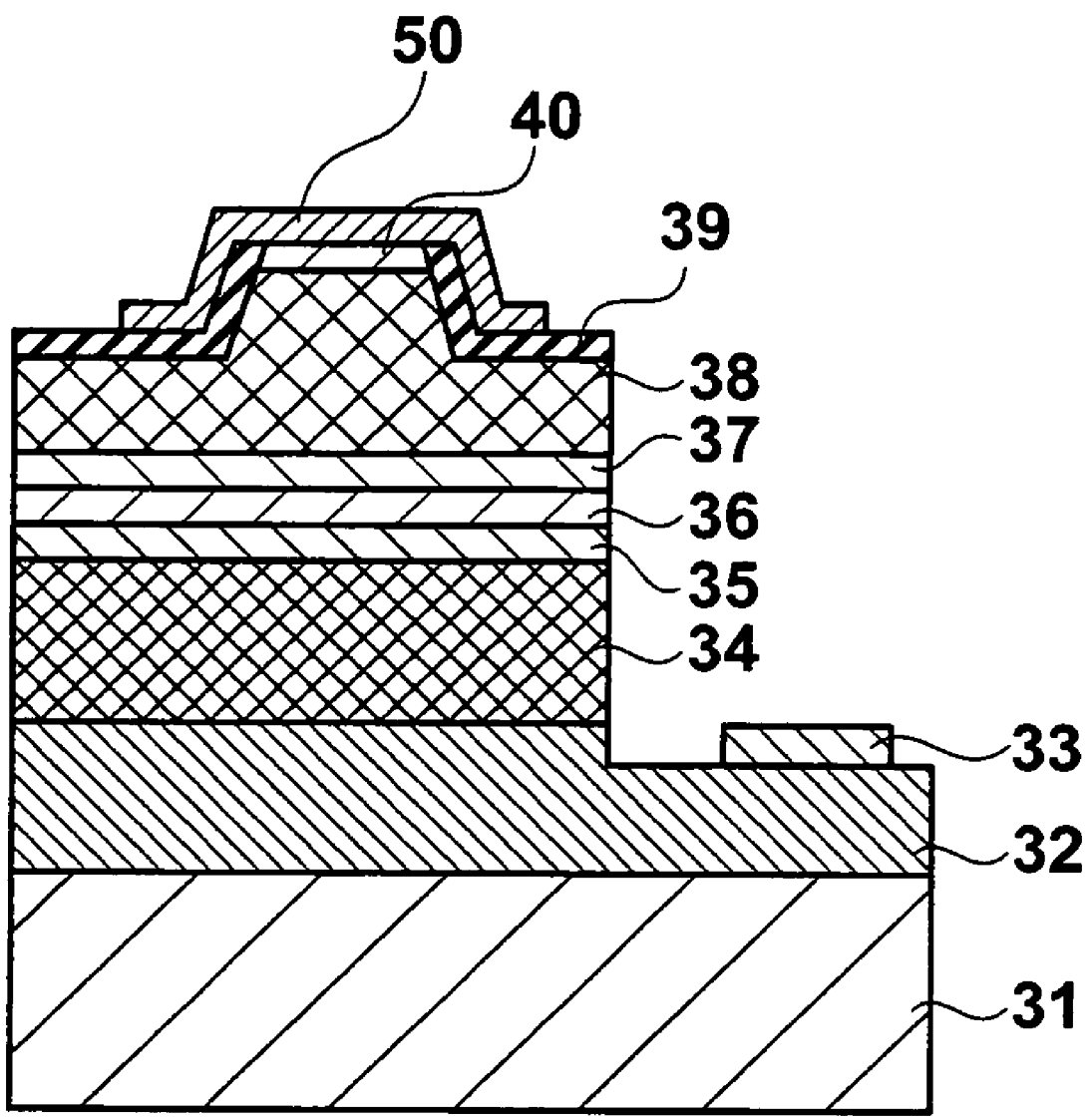
FIG. 4 is a sectional view illustrating one example of an LD structure in a gallium nitride semiconductor light emitting element.

Next, one example of an LD in a gallium nitride semiconductor light emitting element is illustrated in FIG. 4. The gallium nitride semiconductor crystal 2 is grown on the R plane of the sapphire substrate 1 to make the growth surface the A plane. As a method of production, the well-known MOCVD method or the like is used for the growth. For example, on the R plane of a sapphire substrate 31, a buffer layer 32 of approximately 1 to 3 μm including undoped GaN, an n type clad layer 34 of approximately 1 to 5 μm including an Si-doped AlGaN/GaN super lattice layer, and the following layers of approximately 0.2 to 1 μm, respectively, are laminated sequentially: an n type super lattice layer 35 including Si-doped InGaN/GaN; an MQW active layer 36; a p type electron block layer 37 including AlGaN produced by doping Mg at a concentration of $1 \times 10^{19}$ cm$^{-3}$ or less; and a p type clad layer 38 including an Mg doped AlGaN/GaN super lattice layer. An MQW active layer 36 is formed in a multi-layer structure in which a well layer including $In_{0.17}Ga_{0.83}N$ of 1 to 3 nm and a barrier layer including $In_ZGaN$ ($0 \leq Z \leq 0.05$) of 10 to 20 nm are alternately laminated on each other for 3 to 10 cycles.

After the p type clad layer 38 is patterned by etching to form a ridge, the ridge side face to the flat part of the p type clad layer 38 are covered with an insulating layer 39 and the ridge part of the p type clad layer 38 is laminated with a p type contact layer 40 including Mg-doped GaN.

After the formation of the p type contact layer 40, parts of the p type contact layer 40, the p type clad layer 38, the p type electron block layer 37, the MQW active layer 36, the n type super lattice layer 35, the n type clad layer 34 and the buffer layer 32 are mesa etched by reactive ion etching or the like and removed. Thereafter, on the etched face of the buffer layer 32 is formed an n electrode 33 by vapor deposition and on the p type contact layer 40 is formed a p electrode 50 by vapor deposition.

Also in an LD constructed as in FIG. 4, the buffer layer 32, the n type clad layer 34, the n type super lattice layer 35, the MQW active layer 36, the p type electron block layer 37, the p type clad layer 38 and the p type contact layer 40 all have the A plane as a growth surface. Here, at the interface between the AlGaN electron block layer 37 on the p side and the GaN barrier layer of the MQW active layer 36 (Z=0), an electric field is generated. However, when the growth surface becomes a non-polar face, although an electric field E is generated from the GaN barrier layer toward the p-AlGaN electron block layer 37, as in the case of FIG. 3, the strength of the electric field becomes very smaller than the strength of a conventional electric field illustrated in FIG. 10. Thus, holes injected from the p electrode 41 side tend to be injected into the MQW active layer 36 side of a light emitting region and, therefore carrier depletion can be avoided.

Figure 5:
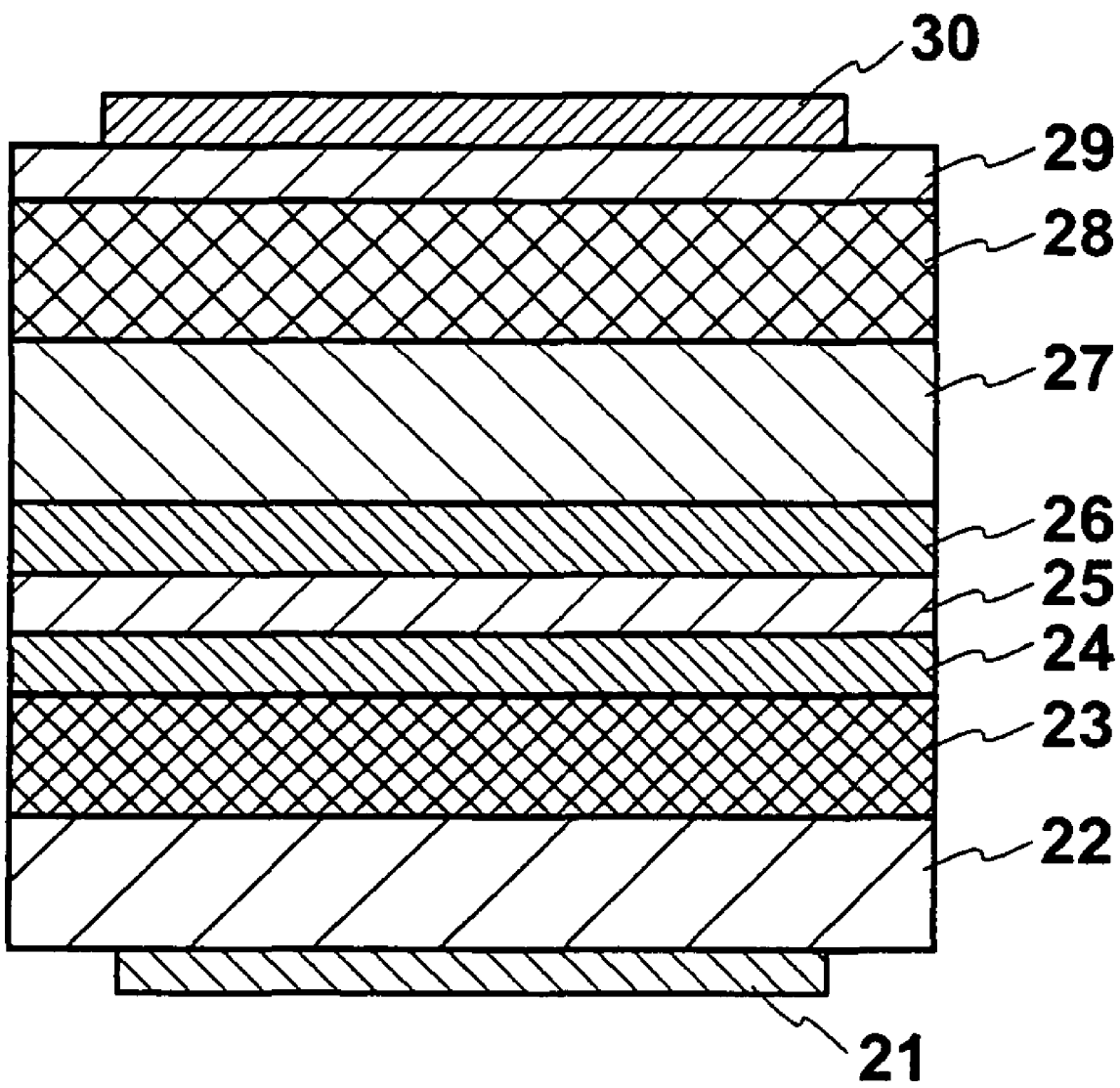
FIG. 5 is a sectional view illustrating one example in a gallium nitride semiconductor light emitting element structure.

On the other hand, FIG. 5 shows one example of a gallium nitride semiconductor light emitting element in which the gallium nitride semiconductor crystal 2 is grown on the A plane or M plane of the GaN substrates 3, 4 to make the growth surface the A plane or M plane.

In a case where an LED is formed using the structure of FIG. 5, by means of the well-known MOCVD method or the like, for example, on the A plane or M plane of a GaN substrate 22, an Si-doped AlGaN of approximately 0.8 μm as an n type clad layer 23, undoped GaN or n doped GaN of about 0.1 μm as a n type light guide layer 24, MQW active layer 25, undoped GaN or p doped GaN of about 0.1 μm as a p type light guide layer 26, AlGaN of 200 Å produced by doping Mg at a concentration of $1 \times 10^{19}$ cm$^{-3}$ or less as an electron block layer 27, a p type clad layer 28 and Mg-doped GaN as a p type contact layer 29 are sequentially laminated.

In addition, an MQW active layer 25 is made to have, for example, a multiple quantum well structure produced by laminating a well layer of $In_{0.08}GaN$ of 30 Å and a barrier layer (obstacle layer) of $In_{0.01}GaN$ of 150 Å; the p type clad layer 28 is made to be a super lattice layer produced by alternately laminating undoped AlGaN of 20 Å to 50 Å and Mg-doped GaN of 20 Å to 50 Å. Finally, a positive electrode 30 (p electrode) and a negative electrode 21 (n electrode) are formed by vapor deposition. The n type clad layer 23, the n type light guide layer 24, the MQW active layer 25, the p type light guide layer 26, the electron block layer 27, the p type clad layer 28 and the p type contact layer 29, of a gallium nitride semiconductor LED laminated in the manner, all have the A plane or M plane as a growth surface.

On the other hand, in a case where an LD is formed using the structure of FIG. 5, by means of the well-known MOCVD method or the like, for example, on the A plane or M plane of the GaN substrate 22, the n type clad layer 23, undoped GaN or n doped GaN of about 0.1 μm as the n type light guide layer 24, the MQW active layer 25, undoped GaN or p doped GaN of about 0.1 μm as the p type light guide layer 26, AlGaN of about 200 Å as the electron block layer 27 produced by doping Mg at a concentration of $1\times10^{19}$ cm$^{-3}$ or less, the p type clad layer 28 and Mg-doped GaN as the p type contact layer 29 are sequentially laminated.

Then, the MQW active layer 25 is made to have, for example, a multiple quantum well structure produced by laminating a well layer including $In_{0.08}Ga_{0.92}N$ of 30 Å and a barrier layer (obstacle layer) including $In_{0.01}GaN$ of 150 Å. The n type clad layer 23 is made to be a super lattice layer produced by alternately laminating undoped AlGaN of 20 to 50 Å and Si-doped GaN of 20 to 50 Å. The p type clad layer 28 is made to be a super lattice layer produced by alternately laminating undoped AlGaN of 20 to 50 Å and Mg-doped GaN of 20 to 50 Å. Finally, the positive electrode 30 (p electrode) and the negative electrode 21 (n electrode) are formed by vapor deposition. The n type clad layer 23, the n type light guide layer 24, the MQW active layer 25, the p type light guide layer 26, the electron block layer 27, the p type clad layer 28 and the p type contact layer 29, of a gallium nitride semiconductor LED laminated in the manner, all have the A plane or M plane as a growth surface.

Figure 6:
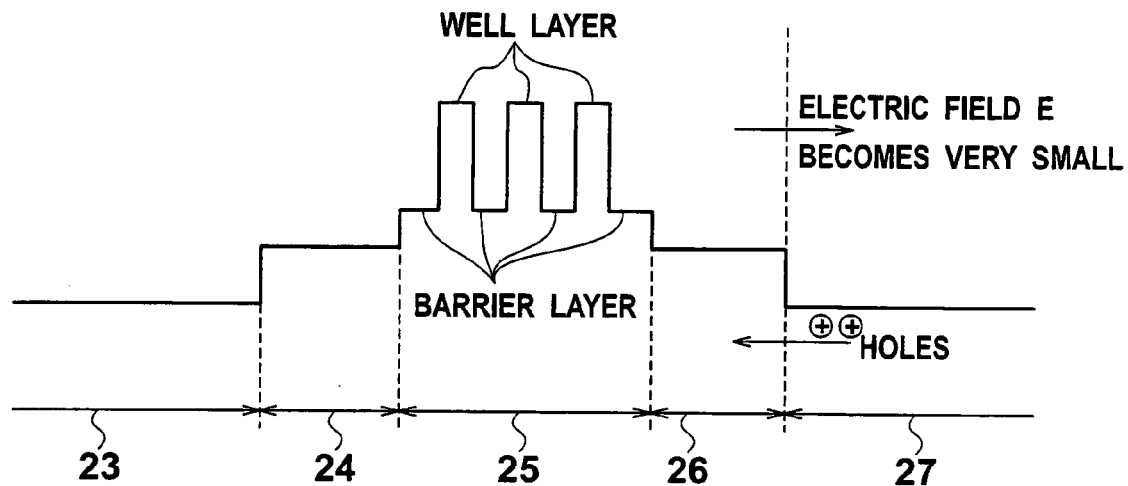
FIG. 6 is a diagram illustrating band gap energies in a valence band of the gallium nitride semiconductor light emitting element of FIG. 5.

Band gap energies in valence bands, when an LED or LD is constituted by the structure of FIG. 5 as described above, are illustrated in FIG. 6. At the interface between the p type light guide layer 26 of GaN and the electron block layer 27 of AlGaN, although an electric field E is generated from the p type light guide layer 26 toward the electron block layer 27, the growth surface becomes a non-polar face, and as shown in FIG. 6, the strength of the electric field becomes extremely smaller than of a conventional electric field illustrated in FIG. 10. Thus, holes injected from the positive electrode 30 side tend to be injected into the MQW active layer 25 side of a light emitting region and, therefore carrier depletion can be avoided.

In addition, at the interface between the p type clad layer 28 of super lattice layers of AlGaN and GaN and the electron block layer 27 of AlGaN, and even at the interface between the p type clad layer 28 and the p type contact layer including GaN, an electric field is generated. However, the growth surface is a non-polar face, so the strength of the electric field generated becomes extremely small. Thus, the effect of the field becomes small regardless of the direction of the electric field and, therefore carrier depletion can be avoided.

Incidentally, the generation of an electric field E due to spontaneous polarization and piezo polarization attributable to interface stress is observed not only at the interface of AlGaN/GaN but also at the interface between AlGaN and another GaN semiconductor layer. In particular, at the interface of AlGaN/InGaN and at the interface of $Al_XGaN/Al_YGaN$ (X>Y), a similar electric field is generated. In other words, when the epitaxial growth direction of a gallium nitride semiconductor crystal on a substrate is from the Ga polar face, electric fields E are generated from the InGaN semiconductor layer toward the AlGaN semiconductor layer at the interface of AlGaN/InGaN, and from the $Al_YGaN$ semiconductor layer toward the $Al_XGaN$ semiconductor layer at the interface of $Al_XGaN/Al_YGaN$ (X>Y), in the same manner as in FIG. 10. Holes from the p electrode side receive electric repulsion to thereby less likely flow into the light emitting region.

Figure 7:
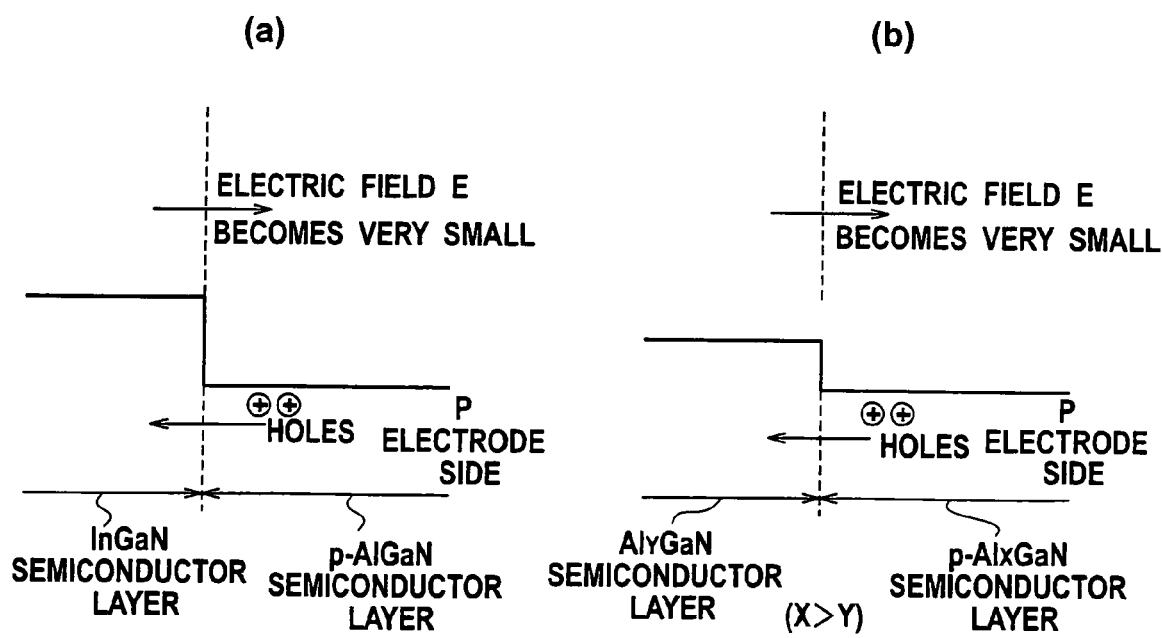
FIG. 7 is a diagram illustrating an electric field state at an AlGaN/InGaN interface and at an $Al_X$GaN/$Al_Y$GaN (X>Y) interface.

For example, the barrier layers of the MQW active layers 16, 36 (Z≠0) can use InGaN in a structure in FIG. 2 or 4, and if the structure is utilized, the interface of AlGaN/InGaN is formed between the p type electron block layers 17, 37 of AlGaN and the barrier layer. Additionally, in a structure of FIG. 5, an $Al_XGaN/Al_YGaN$ (X>Y) interface may be formed between the p type clad layer 28 of super lattice layers of AlGaN and GaN and the electron block layer 27 of AlGaN. FIG. 7(a) illustrates a state of the interface of AlGaN/InGaN and FIG. 7(b) illustrates a state of the interface of $Al_XGaN/Al_YGaN$ (X>Y) together with band energies in valance electron bands.

When the growth surface of a gallium nitride semiconductor crystal is a Ga polar face, holes from the p electrode side receive electric repulsion to thereby be less likely injected into the light emitting region even at each interface described above. However, as in a structure illustrated in FIG. 1, if the growth direction of the semiconductor layer of a gallium nitride semiconductor crystal is made to be from a non-polar face, as illustrated in FIG. 7(a), the strength of an electric field E generated from the InGaN semiconductor layer toward the AlGaN semiconductor layer at the interface of AlGaN/InGaN can be made very small. Thus, holes can be easily injected from the p electrode side into the light emitting region.

In addition, as shown in FIG. 7(b), even at the $Al_XGaN/Al_YGaN$ (X>Y) interface, the strength of an electric field E generated from the $Al_YGaN$ semiconductor layer toward the $Al_XGaN$ semiconductor layer can be made very small. Thus, holes can be easily injected from the p electrode side into the light emitting region. In this manner, the carrier depletion is prevented and the drive voltage can be stabilized.

In particular, if the doping concentration of the impurity Mg in the AlGaN semiconductor layer or the aforementioned $Al_YGaN$ semiconductor layer becomes $1\times10^{19}$ cm$^{-3}$ or less, when the growth face is the Ga polar face, an electric field of a very large strength is generated at each interface of AlGaN/InGaN, AlGaN/GaN and $Al_XGaN/Al_YGaN$ (X>Y). However, for the present invention, since the growth surface is made to be a non-polar face, the strength of an electric field at each interface above can be extremely decreased. Thus, holes from the p electrode side can be readily injected into the light emitting region.

The invention claimed is:

1. A gallium nitride semiconductor light emitting element, which includes
   at least an n type semiconductor layer,
   a light emitting region and
   a p type semiconductor layer, in listed order, on a substrate, which has an interface between an AlGaN semiconductor layer and a GaN semiconductor layer, the AlGaN semiconductor layer formed at the p type semiconductor layer side and containing Mg of $10^{19}$ cm$^{-3}$ or less, and
   the GaN semiconductor layer is positioned closer to the n layer than the AlGaN semiconductor layer is, wherein
   the AlGaN semiconductor layer is a p type electron block layer,
   a p type clad layer is formed on the p type electron block layer, and
   from the n type semiconductor layer to the p type clad layer, the growth face is not formed to have any one of nitrogen polarity or Ga polarity of GaN, but is formed in a non-polar direction.

2. The gallium nitride semiconductor light emitting element according to claim 1, wherein the p type clad layer includes a second interface between a second AlGaN semiconductor layer and a second GaN semiconductor layer.

* * * * *

UNITED STATES PATENT AND TRADEMARK OFFICE
CERTIFICATE OF CORRECTION

| | | |
|---|---|---|
| PATENT NO. | : 7,872,269 B2 | Page 1 of 1 |
| APPLICATION NO. | : 12/085836 | |
| DATED | : January 18, 2011 | |
| INVENTOR(S) | : Ken Nakahara | |

It is certified that error appears in the above-identified patent and that said Letters Patent is hereby corrected as shown below:

Title Page, Item 74 (Attorney, Agent, or Firm)

"Rebin & Berdo, PC" should be changed to --Rabin & Berdo, P.C.--

Signed and Sealed this
Twenty-fifth Day of December, 2012

David J. Kappos
*Director of the United States Patent and Trademark Office*